(12) United States Patent
Martinez et al.

(10) Patent No.: US 7,275,203 B2
(45) Date of Patent: Sep. 25, 2007

(54) ARCHITECTURE FOR AN ITERATIVE DECODER

(75) Inventors: Alfonso Martinez, Amsterdam (NL); Massimo Rovini, Pisa (IT)

(73) Assignee: Agence Spatiale Europeenne, Paris (FR)

( * ) Notice: Subject to any disclaimer, the term of this patent is extended or adjusted under 35 U.S.C. 154(b) by 360 days.

(21) Appl. No.: 10/926,063

(22) Filed: Aug. 26, 2004

(65) Prior Publication Data

US 2005/0102597 A1    May 12, 2005

(30) Foreign Application Priority Data

Aug. 28, 2003  (FR) .................................. 03 10261

(51) Int. Cl.
*H03M 13/03*    (2006.01)
(52) U.S. Cl. ...................... 714/794; 714/795; 714/793
(58) Field of Classification Search ................ 714/794, 714/792, 714, 765, 766, 791, 798
See application file for complete search history.

(56) References Cited

U.S. PATENT DOCUMENTS

| | | | |
|---|---|---|---|
| 2003/0043487 A1* | 3/2003 | Morita et al. .................. | 360/25 |
| 2003/0066020 A1* | 4/2003 | Morita et al. .................. | 714/794 |
| 2003/0226095 A1* | 12/2003 | Cameron et al. ........... | 714/792 |

FOREIGN PATENT DOCUMENTS

| | | |
|---|---|---|
| DE | 102 14 393 A1 | 2/2003 |
| EP | 0 973 292 A2 | 1/2000 |

OTHER PUBLICATIONS

C. Berrou, et al., "Near Shannon Limit Error—Correcting Coding and Decoding : Turbo-Codes (1)", IEEE, 1993, pp. 1064-1070.
R.M. Pyndiah, "Near-Optimum Decoding of Product Codes: Block Turbo Codes", IEEE Transactions on Communications, vol. 46, No. 8, Aug. 1998, pp. 1003-1010.

(Continued)

*Primary Examiner*—Guy Lamarre
*Assistant Examiner*—Fritz Alphonse
(74) *Attorney, Agent, or Firm*—Clark & Brody

(57) ABSTRACT

Iterative decoder comprising a plurality of servers which perform the iterative decoding of a data block each, an input buffer memory and a control unit which performs a statistical multiplexing of the data at input, which are firstly stored in the input buffer memory and successively processed by one of the servers. The input buffer memory comprises N+L memory locations, where N is the number of servers and L is the number of so-called additional locations. Each block to be decoded which is received while all the servers are busy is stored in one of the L additional locations possibly available, or it is lost if the input buffer memory is entirely filled. The number L of additional locations and the number N of servers are such that the probability $P_B$ of a block being lost, calculated on the basis of a queuing model of D/G/N/N+L type, satisfies the condition $P_B \leq \alpha \cdot FER^*$, where FER* is the error rate in the blocks allowed and $\alpha<1$; typically $\alpha$ is of the order of 0.01. Process for manufacturing such an iterative decoder comprising a step of design and a step of hardware embodiment.

19 Claims, 9 Drawing Sheets

OTHER PUBLICATIONS

A. Matache, et al., "Stopping Rules for Turbo Decoders", TMO Progress Report 42-142, Aug. 15, 2000, pp. 1-22.

Y. Wu, et al., "A Simple Stopping Criteron for Turbo Decoding", IEEE Communications Letters, vol. 4, No. 8, Aug. 2000, pp. 258-260.

Sanjay K. Bose, *Basic Queuing Theory*, 2002 (XP002282293).

B. Bougard, et al, *A Class of Power Efficient VLSI Architectures for High Speed Turbo-Decoding*, IEEE Global Telecommunications Conference, Nov. 17, 2002.

E. Boutillon, et al., *VLSI Architectures for the MAP Algorithm*, Feb. 2003, IEEE Transactions of Communications, vol. 51, No. 2, pp. 175-185.

F. Viglione, et al., *A 50 Mbit/s Iterative Turbo-Decoder*, Mar. 27, 2000, Conference Proceedings Article, pp. 176-180.

Curt Schurgers, et al., *Optimized Map Turbo Decoder*, Oct. 11, 2000, Conference Proceedings Article, pp. 245-254.

R. Roy, et al., *Efficient Buffer Sharing in Shared Memory ATM Systems With Space Priority Traffic*, April 200, IEEE Communications Letters, vol. 6, No. 4, pp. 162-164.

W. Gross, et al., *Applications of Algebraic Soft-Decision Decoding of Reed-Solomon Codes*, Jul. 23, 2003, IEEE Transactions on Communications.

M. Katevenis, et al., *Pipelined Memory Shared Buffer for VLSI Switches*, Oct. 25, 1995, Computer Communication Review, No. 4, pp. 39-48.

A. Martinez, et al., *Iterative Decoders Based on Statistical Multiplexing*, European Research and Technology Space centre, date unknown.

J. Vogt et al., *Increasing the Throughput of Iterative Decoders*, Feb. 4, 2001.

\* cited by examiner

ARCHITECTURE FOR AN ITERATIVE DECODER

FIELD OF THE INVENTION

The invention pertains to an iterative decoder, and more particularly to an iterative decoder intended to be embodied in the form of an integrated circuit, or a plurality of integrated circuits, using very large scale integration (VLSI) technology. This decoder exhibits a novel architecture making it possible to considerably reduce the complexity (area of silicon occupied) and/or the power consumption as compared with the decoders known from the prior art and/or to increase the data bit rate for given complexity and given power consumption; for this reason it is particularly suited to space applications and to mobile telephony.

BACKGROUND OF THE INVENTION

The transmission of a digital signal over a noisy channel generally comprises the use of an error correction code so as to obtain a bit error rate (BER) or block error rate (also frame error rate, FER) which is acceptable even with a small signal-to-noise ratio. As a general rule, the decoding operation is more complex than the coding operation in terms of computation time and equally in terms of memory, and hence of area of silicon occupied.

Among the various coding and decoding algorithms which have been developed, iterative codes, such as "turbo codes", have acquired great significance in the last few years. These codes are described, for example, in the following articles:

"Near Shannon limit error-correcting coding and decoding: Turbo codes", P. Thitimajshima, C. Berrou, A Glavieux, IEEE ICC 93, pages 1064-1070, 1993 Geneva; and "Near-optimum decoding of product codes: Block turbo codes", R. M. Pyndiah, IEEE Transactions on Communications, 46(8): 1003-1010, 1998;

as well as in European patent EP 0 753 696 and in international application WO 01/06661.

"Turbo" codes are obtained by parallel concatenation of convolutional codes; codes obtained by series concatenation of convolutional codes, which have similar properties and also constitute a field of application of the present invention are known as "turbo-like" codes.

These codes are characterized by the fact that the decoding is an iterative procedure and the BER and the FER decrease at each iteration. Often the number $N_{it}$ of iterations is fixed and it is determined by considering the case of the blocks that are most corrupted by noise. It is obvious that this entails a waste of resources, since most blocks undergo more iterations than necessary. For this reason stopping rules have been envisaged; see in this regard:

"Stopping rules for turbo decoders" F. Pollara, A. Matache, S. Dolinar, Technical Report 42-142, TMO Progress Report, August 2000; and "A simple stopping criterion for turbo decoding" W. J. Ebel, Y. Wu, B. D. Woermer, IEEE Communications Letters, 4(8): 258-260 (2000).

To increase the data bit rate, use is typically made of decoders consisting of several replicas of the same decoding module, each module taking charge of the processing of a block of bits. Disregarding problems related to multiplexing on input and to demultiplexing on output, the bit rate is proportional to the number M of modules used. There are essentially three architectures based on this principle: the pipeline architecture, the parallel architecture and the matrix architecture, which are illustrated by FIGS. 1A, 1B and 1C respectively.

In the pipeline architecture, $M=N_{it}$ modules are connected in series as in an assembly line. A block of bits introduced at the input of the line exits same after having been processed once by each module, hence after having undergone $N_{it}$ iterations.

In the parallel architecture, M modules each perform the complete decoding ($N_{it}$ iterations) of a block of bits. It is easy to appreciate that if $M=N_{it}$ the performance of a parallel decoder is the same as that of a pipeline decoder, both in terms of complexity and bit rate. If $M>N_{it}$, the bit rate is higher, but so is the complexity, whereas the reverse effect is obtained for $M<N_{it}$. Here and subsequently in this document, the term "complexity" is understood to mean a quantity proportional to the area occupied on an electronic chip by a circuit embodying the decoder. Complexity depends both on the architecture of the decoder and on the microelectronic technology chosen; for a given technology, the complexity makes it possible to compare various architectures.

The matrix architecture is merely a generalization of the previous two: a matrix decoder is composed of M pipeline decoders in parallel.

These architectures are essentially equivalent and the choice to use one rather than another depends on considerations specific to the application considered. A decoder based on any one of them can operate only for a fixed number of iterations, this entailing a waste of hardware resources and a higher than necessary energy consumption.

More recently, modular decoder architectures allowing the application of stopping rules have been developed.

Document DE 102 14 393, which represents the closest state of the art, discloses an iterative decoder comprising a plurality of servers, each iteratively decoding a data block, an input buffer including more memory locations than servers and a control unit for allocating data packets stored in the input buffer to the different servers.

Document WO 02/067435 A1 describes a decoder comprising a plurality of decoding modules in parallel and a device for dynamically allocating incoming data packets. Although the allocating device is equipped with a temporary memory, the decoder is designed in such a way that the probability of an incoming data packet not finding any free decoding module is small. In order for this condition to hold, it is necessary to use a large number of modules, of which at least one will not be busy almost at each instant. This therefore results in a waste of hardware resources. Moreover, this document provides no information which makes it possible to determine the number of decoding modules and of elements of the temporary memory as a function of the performance required and of the operating conditions of the decoder.

Document EP 0 973 292 A2 describes the use of a buffer memory for each decoding module (also called a "server"), so as to produce as many queues as modules, plus possibly a global buffer memory at the level of the allocating device. In this document the use of a stopping criterion is not described: on the contrary, the number of iterations is determined a priori on the basis of the ratio of the power of the carrier to that of the noise. While this ratio remains constant, the duration of the decoding is the same for all the packets: there is therefore the same problem of overdimensioning encountered in the architectures with a fixed number of iterations described above.

BRIEF SUMMARY OF THE INVENTION

A subject of the present invention is an iterative decoder exhibiting a novel architecture which allows better use of hardware resources as compared with the prior art. Such an architecture is dubbed "matrix of servers operating simultaneously with a buffer memory" (otherwise known as "Buffered Array of Concurrent Servers" or BACS).

More precisely, the invention pertains to an iterative decoder, comprising:
- a plurality of servers which each perform the iterative decoding of a data block;
- an input buffer memory for temporarily storing the data blocks to be decoded by the servers;
- a control unit for allocating each data block to be decoded to a server;

in which the number of iterations of the decoding procedure performed by each server is determined on the basis of a stopping criterion and the control unit allocates data blocks to be decoded to the various servers as and when they make themselves available, wherein:
- the input buffer memory comprises N+L memory locations, where N is the number of servers and L, generally>0, is the number of so-called additional locations;
- each block to be decoded which is received while all the servers are busy is stored in one of the L additional locations possibly available, or it is lost if the input buffer memory is entirely filled; and
- the number L of additional locations and the number N of servers are such that the probability $P_B$ of a block being lost, calculated on the basis of a queuing model of D/G/N/N+L type, satisfies the condition $P_B \leq \alpha \cdot FER^*$, where FER* is the error rate in the blocks allowed and $\alpha<1$.

Preferably $\alpha \leq 0.01$.

According to various embodiments of an iterative decoder according to the invention:
- among all the pairs of values of L and of N making it possible to attain a sufficiently high bit rate $\Gamma$ and a sufficiently low blocking probability $P_B$, that one which minimizes the silicon area occupied by the decoder is chosen;
- the input buffer memory is common to all the servers (22) and is accessible in parallel;
- the data packets stored in the input buffer memory are allocated to the available servers on the basis of the first-in-first-out principle (FIFO);
- an output buffer memory for temporarily storing the data blocks decoded by the servers is also provided;
- the control unit verifies at regular intervals whether the stopping condition for each server is satisfied;
- in a particular embodiment of the invention the stopping condition is verified after each iteration of the decoding procedure;
- the servers are decoders chosen from among: "turbo" decoders, "turbo-like" decoders, low-density parity check decoders (LDPC), interference cancellation decoders (IC), serial interference cancellation decoders (SIC) and parallel interference cancellation decoders (PIC);
- an extrinsic memory used by the servers during decoding is also provided.

The invention also pertains to a communication system using an iterative decoder as described above.

The invention also pertains to a process for manufacturing an iterative decoder as described above comprising the steps consisting in:
A) designing the decoder by applying the substeps consisting in:
  a) determining at least one of the parameters chosen from: the bit rate $\Gamma^*$ of the data to be decoded, the energy per information bit $E_b/N_0$ of the signal carrying the information to be decoded, the error rate allowable in the bits or in the blocks (BER* or FER*), the maximum allowable blocking probability $P_B^*$, the ratio $\alpha$ of this probability to the allowable error rate, as well as a cost function C(N, L) which must be minimized by the decoder;
  b) determining on the basis of at least one of said parameters a pair (N, L) which minimizes the cost function C(N, L); and
B) embodying a decoder, having the values N, L determined in substep A.b.

According to a first variant, step A.b comprises:
i. choosing an embodiment of the servers;
ii. determining a maximum value $L_{max}$ and a minimum value $L_{min}$ which are allowable for the number of additional locations of the input buffer memory;
iii. using the data obtained during substep A.a to calculate the probability density function FDP of the service time $T_s$, that is to say the time required by a server to decode an information block such that the error rate is less than or equal to BER* or FER*, as well as the expected value $E\{T_s\}$ of said service time;
iv. initially putting the number of additional locations of the input buffer memory equal to $L=L_{min}$;
v. initially putting the number of servers equal to $N=\Gamma^* \cdot E\{T_s\}$;
vi. modeling the decoder as a queuing system of D/G/N/N+L type and calculating the corresponding blocking probability $P_B$;
vii. if $P_B>P_B^*=\alpha \cdot FER^*$ or $\alpha \cdot BER^*$, increasing N by a unit and repeating substep vi;
viii. otherwise picking the pair (N, L);
ix. if $L^*<L_{max}$ increasing L by a unit (410) and restarting the procedure from step v;
x. out of all the pairs (N, L) picked, choosing that one (N*, L*) which makes it possible to minimize the cost function C(N, L).

According to a second variant, step A.b comprises:
i. choosing an embodiment of the servers;
ii. determining a maximum value $L_{max}$ and a minimum value $L_{min}$ which are allowable for the number of additional locations of the input buffer memory;
iii. using the data obtained during substep A.a to calculate the probability density function FDP of the service time $T_s$, that is to say the time required by a server to decode an information block in such a way that the error rate is less than or equal to BER* or FER*, as well as the expected value $E\{T_s\}$ of said service time;
iv. initially putting the number of additional locations of the input buffer memory equal to $L=L_{min}$;
v. taking an initial value of the number of decoders $N^*=N_{wc}=\Gamma^*/\Gamma_{serv}$, $\Gamma_{serv}$ being the data bit rate of each server when considering a number of decoding iterations $N_{it}$ fixed at the value necessary to obtain the allowable error rate FER* or BER*.
vi. modeling the decoder as a queuing system of D/G/N/N+L type and calculating the corresponding blocking probability $P_B$;

vii. if $P_B < P_B^* = \alpha FER^*$ (or $\alpha BER^*$), decreasing $N^*$ by a unit and repeating substep vi;

viii. otherwise picking the pair (N+1, L);

ix. if $L^* < L_{max}$ increasing $L^*$ by a unit and restarting the procedure from step v;

x. out of all the pairs (N, L) picked, choosing that one which makes it possible to minimize the cost function C(N, L).

According to a third variant, step A.b comprises:

i. undertaking the design of said decoder for various values of the energy per information bit $E_b/N_0$;

ii. choosing the pair (N*, L*) which makes it possible to obtain an allowable error rate (BER* or FER*) at the bit rate $\Gamma^*$ of the data to be decoded for the lowest value of the energy per information bit $E_b/N_0$, while giving, for the cost function C(N, L), a value less than or equal to a maximum allowable value C*;

According to a fourth variant, step A.b comprises:

i. undertaking the design of said decoder for various values of the bit rate $\Gamma$;

ii. choosing the pair (N*, L*) which makes it possible to obtain the highest bit rate $\Gamma^*$ an allowable error rate (BER* or FER*) for the chosen value of the energy per information bit $E_b/N_0$, while giving, for the cost function C(N, L) a value lower than or equal to a maximum allowable value C*.

According to a particular embodiment of the invention, the cost function C(N, L) considered in the manufacturing processes described above is proportional to the physical dimensions (complexity) of the electronic circuit which constitutes the decoder.

BRIEF DESCRIPTION OF THE DRAWINGS

Other characteristics, details and advantages of the invention will emerge from reading the description offered with reference to the appended drawings, given by way of example, and in which.

DETAILED DESCRIPTION OF THE INVENTION

Figure 2:
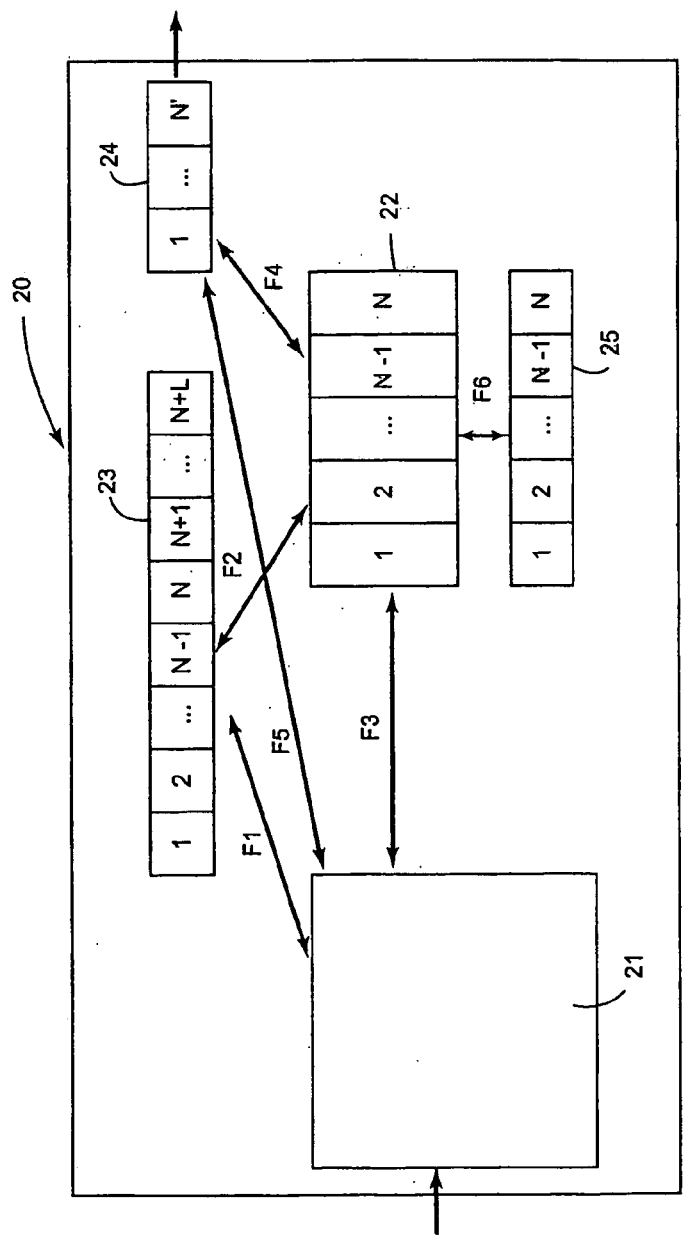
FIG. 2 shows a basic diagram of a decoder according to the invention and serves as a basis for explaining its operation.

According to FIG. 2, a decoder 20 according to the invention comprises a control unit 21, a set of N decoding modules, or "servers" 22, an input buffer memory 23 consisting of N+L locations, an output buffer memory 24 consisting of N' locations and an extrinsic memory 25 (N locations). The double arrows $F_1$-$F_5$ demarcate the data exchanges among the components of the system.

A packet currently being decoded cannot be erased from the input buffer memory 23 so long as it has not been fully processed: for this reason this memory must comprise at least N locations. Moreover, if the iterative code used is a turbo code, each server must be furnished with at least one extrinsic memory location 25 for storing the information exchanged at each iteration between the two elementary decoders of which it consists (see the references mentioned above regarding turbo codes). The extrinsic memory may possibly be absent in the case of other coding techniques.

The control unit 21 accomplishes three tasks:

the statistical multiplexing of the data at input, which are firstly stored in the input buffer memory 23 (arrow $F_1$) and processed successively by one of the servers belonging to the set 22 (arrow $F_2$);

the control of the stopping condition for each server (arrow $F_3$): when this condition holds, the server in question stops the processing in progress, transfers the decoded data packet to the output buffer memory 24 (arrow $F_4$) and gets ready to receive a new packet to be decoded; and the management of the output buffer memory 24 (arrow $F_5$).

Such a control unit can be embodied according to techniques known to the person skilled in the art.

According to alternative variants of the invention, the control unit 21 can accomplish only a part of the tasks mentioned above. For example, each server can autonomously verify its own stopping condition. However, statistical multiplexing constitutes an essential characteristic of a decoder according to the invention.

In a preferred embodiment of the invention, the allocating of the data packets stored in the input buffer memory to the servers available is managed by the control unit 21 on the basis of the first-in-first-out (FIFO) principle, that is to say the packets are processed in the same order in which they are received, but other principles may be applied. For example, if the decoding of a packet turns out to be particularly lengthy, it may be interrupted so as to deal with an increase in the data bit rate at input and resumed later.

Advantageously, several servers can simultaneously access the buffer memory, which is a shared resource.

Several embodiments of iterative decoding modules are known to the person skilled in the art, for this reason their structure and their performance will not be discussed here. For more information see, for example, documents EP 1 022 860 B1, WO 01/06661 and EP 0 735 696 B1. In what follows it will be assumed that the servers are identical to one another, but the more general case of different servers comes within the scope of the present invention.

If a data packet to be decoded is received while all the N servers, and hence the first N locations of the input buffer memory, are occupied, said packet must be stored in one of the L additional memory locations until a server becomes free. The decoder therefore constitutes a queuing system and its performance can be evaluated with the aid of "queuing theory", explained for example in the text:

"Introduction to Queuing Systems", by S. K. Bose, Kluver/Plenum Publishers, 2001.

Figure 3:
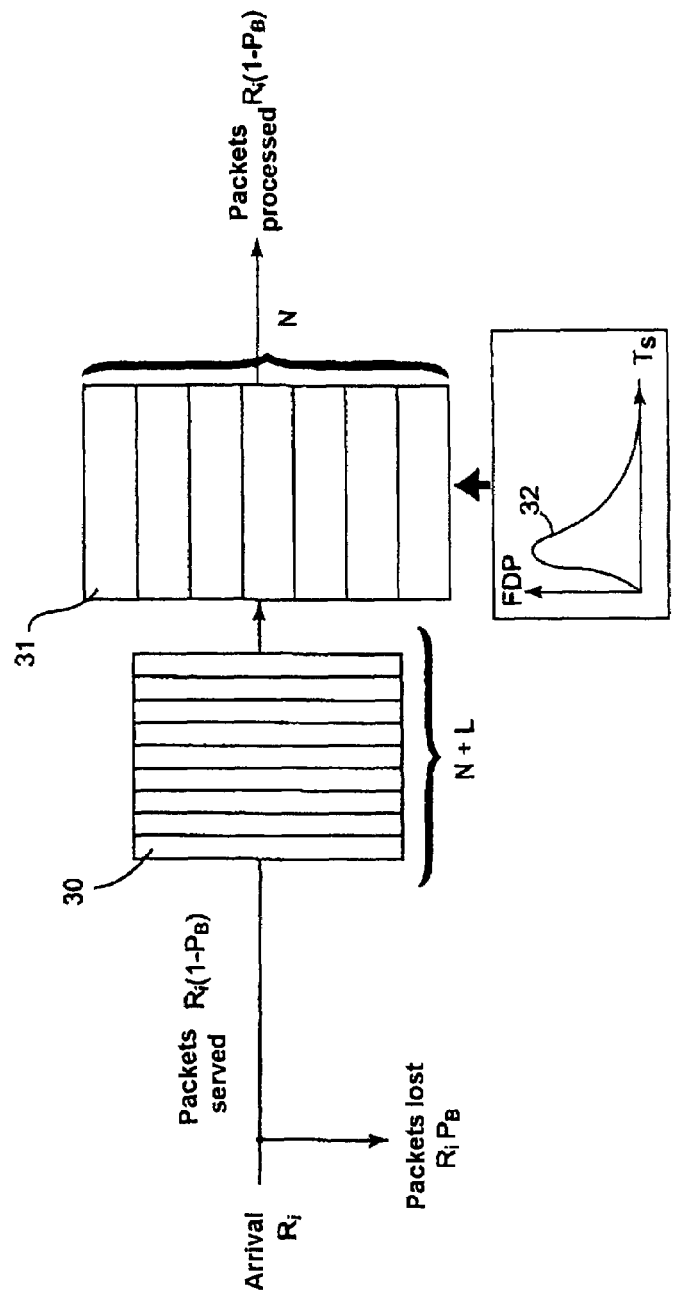
FIG. 3 illustrates the modeling of the decoder which allows its dimensioning according to the invention.

FIG. 3 illustrates the modeling of the system from the point of view of queuing theory. This modeling allows the dimensioning of a decoder according to the invention for a given application, that is to say the determination of the number N of servers and of the number L of additional memory locations as a function of the data bit rate $\Gamma^*$ which must be obtained, of the signal-to-noise ratio (SNR) and of the allowable error rate (BER/FER). In fact, rather than the SNR, use is made of the ratio $E_b/N_0$, where $E_b$ is the energy per information bit and $N_0$ the mean power of the noise. The ratio of the SNR to $E_b/N_0$ is the spectral efficiency $\eta = R_c \eta_M$, where $R_c$ ("code rate") is the ratio of the number of information bits to the number of code bits used to transmit them and the modulation efficiency $\eta_M$ is the number of code bits carried by each symbol transmitted.

The bit rate of each server $\Gamma_{serv}$, as well as the area of silicon occupied by each server ($S_{dec}$) and by each buffer memory location ($S_{I/O}$), are considered to be external parameters, which depend on the technological choices made during the embodying of the decoder.

The decoder is modeled by a queuing system of the D/G/N/N+L type. In Kendall's notation, commonly used in queuing theory, this signifies that the system is characterized by:
- a deterministic rate of arrival (D) of the packets at input, indicated by $R_i$;
- a random service time $T_s$, described by a generic (G) probability density function (FDP);
- N servers (FIG. 3, reference number 30); and
- N+L waiting positions (FIG. 3, reference number 31).

Since the number of waiting positions is finite and the service time is not deterministic, it is possible for a packet to arrive while the queue is full: this packet is therefore lost. The probability of losing a packet, the so-called blocking probability, is indicated by $P_B$ and its value must be small enough so as not to substantially affect the benefits of the decoder. A typical precondition is that $P_B$ should be less than the FER by at least two orders of magnitude: $P_B \leq \alpha \cdot FER^*$, with $\alpha \approx 0.01$.

In principle, the service time $T_s$ is a discrete random variable which can take the values $N_{it} \cdot T_{S,min}$, where $T_{S,min}$ is the time required to perform an iteration and $N_{it}$ is an integer lying between 1, corresponding to the case where the stopping condition is satisfied after a single iteration, and $+\infty$, since the decoding may not converge. In practice, the stopping rules always provide for a maximum number of allowable iterations (for example 100). Curve 32 in FIG. 3 represents an interpolation of the probability density function (FDP) of $T_s$.

Although $T_s$ is, in principle, a time, it is advantageous to measure it as a number of iterations, so as to get away from the physical characteristics of the decoder, which depend on the microelectronic technology used.

Figure 4A:
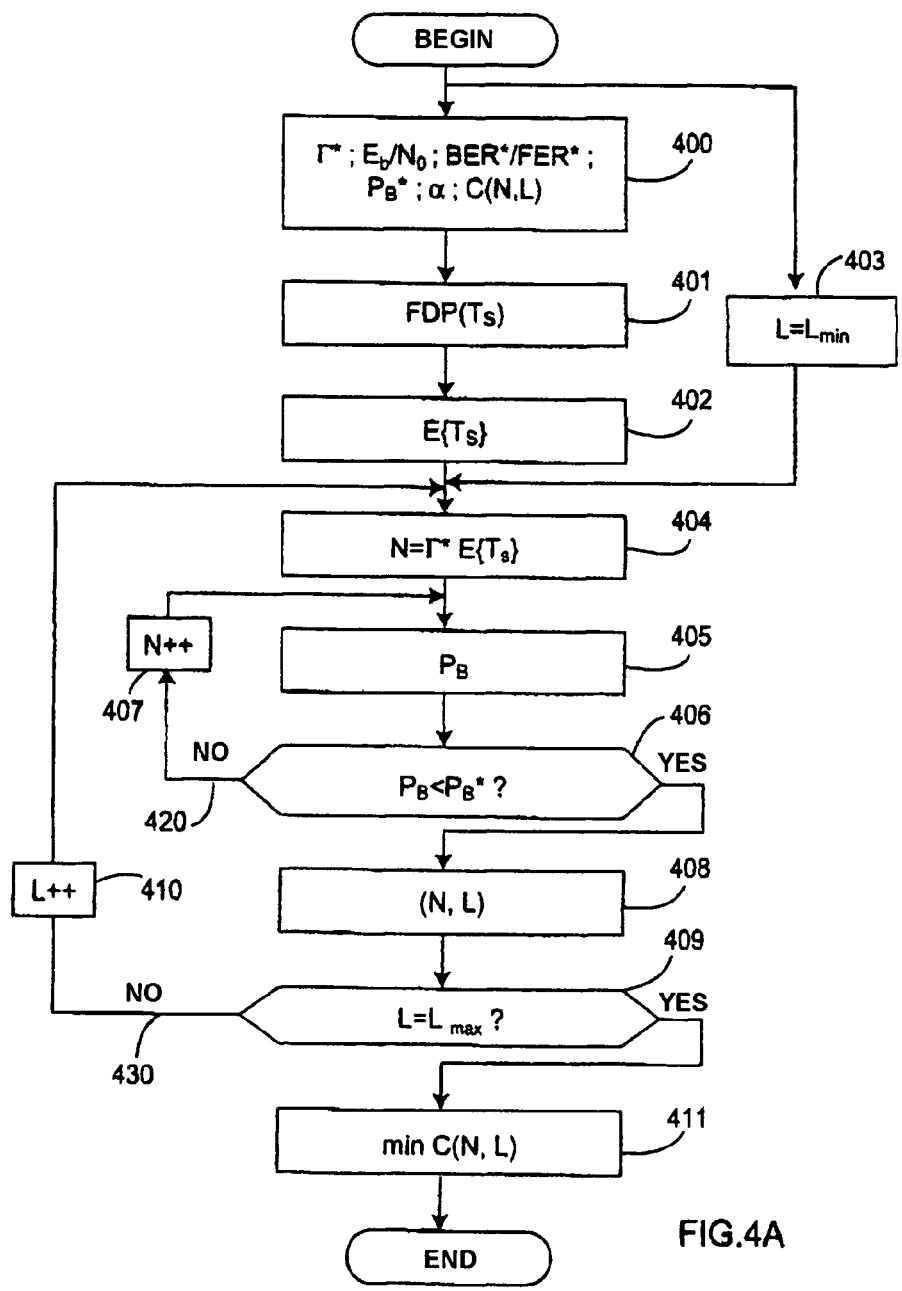
FIGS. 4A to 4D illustrate, in the form of flowcharts, four processes for dimensioning a decoder according to the invention.

As illustrated by the flowchart in FIG. 4A, the first step (400) of the decoder dimensioning process consists in determining the bit rate $\Gamma^*$ of the data to be decoded, the ratio $E_b/N_0$ of the signal received, the acceptable error rate (BER*/FER*), the maximum blocking probability ($P_B^*$) as well as a suitable cost function (C(N, L)). Next, generally with the aid of simulations, the FDP of $T_s$ is determined (step 401).

Having determined the FDP, it is possible to calculate the expected value of $T_s$, $E\{T_s\}$, this constituting step 402.

In step 403, which may for example be simultaneous with step 402, we put $L=L_{min}$, where $L_{min}$ is the lower extreme of an interval determined a priori of allowable values for the number of additional memory locations $[L_{min}, L_{max}]$, in which typically $L_{min}=1$.

In step 404, a first estimate of the number of servers, N*, is calculated by considering an infinite number of waiting positions. In this case, the mean bit rate of each server is simply $1/E(T_s)$. The number of servers necessary to ensure a target bit rate $\Gamma^*$ is therefore $N = \Gamma^* \cdot E(T_s)$.

The blocking probability $P_B$ corresponding to the pair (N, L) is calculated (step 405) and compared with the preset $P_B^*$ (step 406). The calculation of $P_B$ is done by simply counting lost packets during a series of simulations based on the D/G/N/N+L model and using the FDP of $T_s$ determined in step 401. For further particulars regarding these simulations, see the work by S. K. Bose cited above.

The pair (N, L) is picked (step 408) if $P_B < P_B^*$, otherwise N* is incremented by one unit (step 407); the loop 420 is traversed as long as the condition $P_B < P_B^*$ does not hold.

If $L < L_{max}$ (test step 409), the number of additional memory locations is incremented by one unit (step 410) and the cycle begins again from step 404 (loop 430).

Finally, out of all the allowable pairs (N, L) we choose that one (N*, L*) which minimizes the cost function, C(N, L), which represents for example the area of silicon occupied (step 411). If the complexity of the control unit is neglected, the cost function is for example given by $C(N, L) = N \cdot S_{dec} + L \cdot S_{I/O}$.

The only parameter which remains to be determined is the number N' of locations of the output buffer memory. Its value depends on the specific application: two typical cases may for example be considered: M'=N+L and N'=0 (output memory may be completely absent).

From the point of view of the calculation time, the most expensive step is certainly the determination of $P_B$, which has to repeated for each pair (N*, L*) and which requires the carrying out of a significant number of simulations of the queuing system. The other step which requires a high calculation time is the determination of the $FDP(T_s)$ which is done with the aid of several simulations of the decoding algorithm with various input packets. The statistical distribution of the service time for these packets is determined by the value of $E_b/N_0$ under the operating conditions for which the decoder is provided and by the allowable error rate (BER* or FER*). These simulations may be considerably simplified by replacing the stopping rule actually applied in the decoder with the so-called "genie-aided" stopping criterion: the iteration is stopped when a packet has been correctly decoded. Obviously, such a criterion can be applied only within the framework of a simulation, where the data packets are entirely known. The "genie-aided" criterion is generally supplemented with a criterion for stopping after a maximum number of iterations so as to prevent the decoder from remaining blocked in an infinite loop. The maximum number of iterations is chosen in such a way that the error rate is less than or equal to BER* or FER*. Experience shows that this simplified approach gives results that are close enough to those obtained by applying realistic stopping criteria.

Figure 4B:
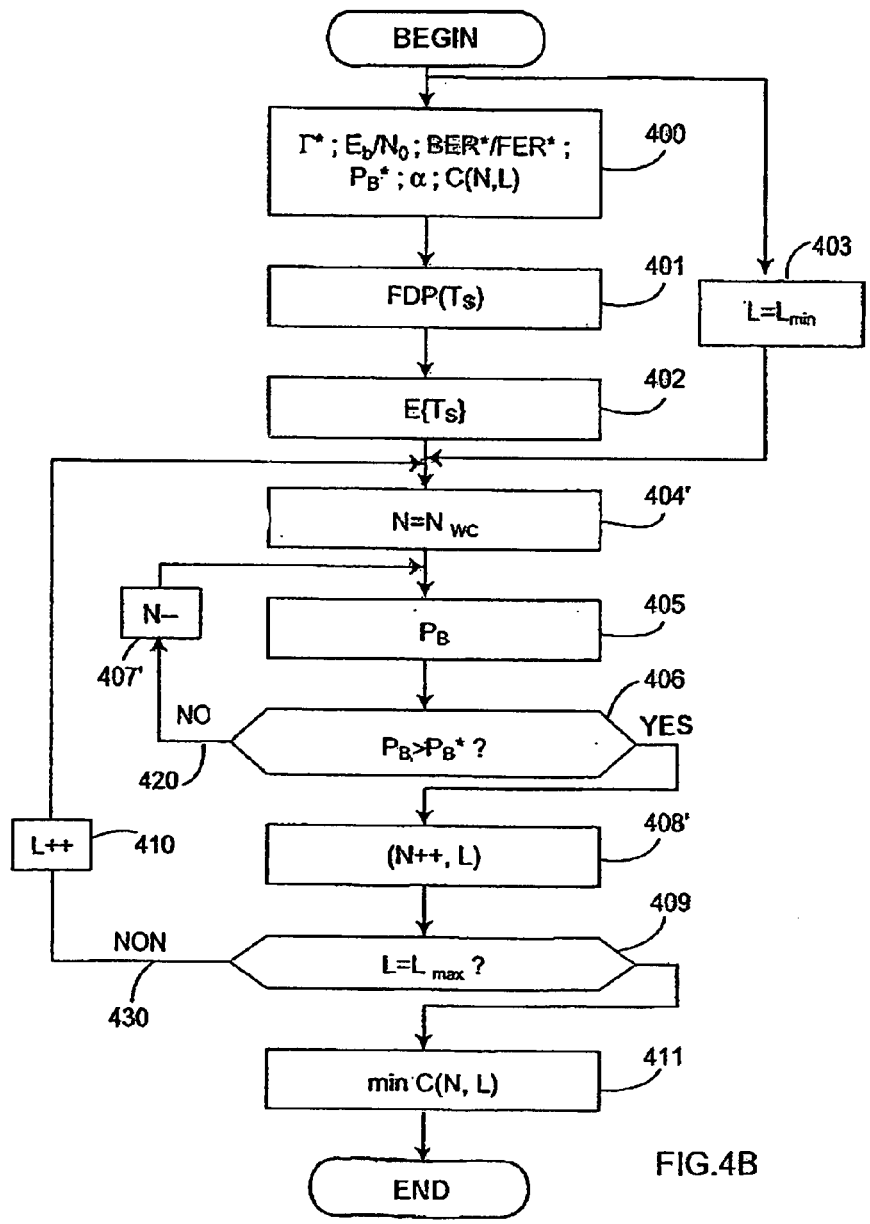

An alternative process is illustrated in FIG. 4B. In this process the determination of N and L can be performed starting from a number of servers $N^* = N_{wc} = \Gamma^*/\Gamma_{serv}$, equal to that which would be required in the case of a parallel architecture with a fixed number of iterations (step 404'), and of an arbitrary number L of additional memory locations. This first estimate of the number of servers is indicated by $N_{wc}$, where "wc" signifies "worst case" since in general this is an overestimate. The stopping probability $P_B$ is therefore calculated and compared with $P_B^*$; N is then decreased (step 407') until $P_B > P_B^*$: at this point the value of N+1, that is to say the number of servers determined in the last but one iteration, is picked (step 408'). The cycle is repeated for all the allowable values of L. This second dimensioning process gives exactly the same results as that represented in FIG. 4A, but requires a higher number of simulations and is therefore less attractive.

In FIGS. 4A and 4B, the operators "++" and "−−" respectively represent the increment and the decrement of one unit.

A concrete example of a design of a decoder according to the invention is now considered. The decoding algorithm used is a serial turbo code, obtained by concatenating two codes: the outer code is a 16-state convolutional with rate ½, the inner code is a 2-state differential code with rate 1/1. The sequence at the output is interleaved with a pseudo-random law ("S-random law"). For further particulars regarding this type of code, see:

"Serial concatenation of interleaved codes: Performance analysis, design and iterative decoding", S. Benedetto et al, IEEE Trans. Inform. Theory, 44(3): 909-926, 1998;

as regards the interleaving algorithm see:

"Turbo codes for PCS applications", F. Pollara and D. Divsalar, IEEE International Conference on Communications, ICC 95, 1:54-59, June 1995.

The servers and the buffer memories are embodied in a conventional manner; for exemplary architectures of iterative decoders that can be used as servers in an embodiment of the present invention, see:

"VLSI Architectures for Turbo Codes", G. Masera, G. Piccinini, M. Ruo Roch, M. Zamboni, IEEE Trans. on VLSI Systems, Vol. 7: 369-379, 1999;

"VLSI Architectures for the MAP Algorithm", E. Boutillon, W. J. Gross, IEEE Trans. on Communication, Vol. 51:175-185, 2003; and "A 50 Mbit/s Iterative Turbo Decoder", F. Viglione, G. Masera, G. Piccinini, M. Ruo Roch, M. Zamboni, Design, Automation and Test in Europe, DATE'00, March 2002, Paris.

Figure 5A:
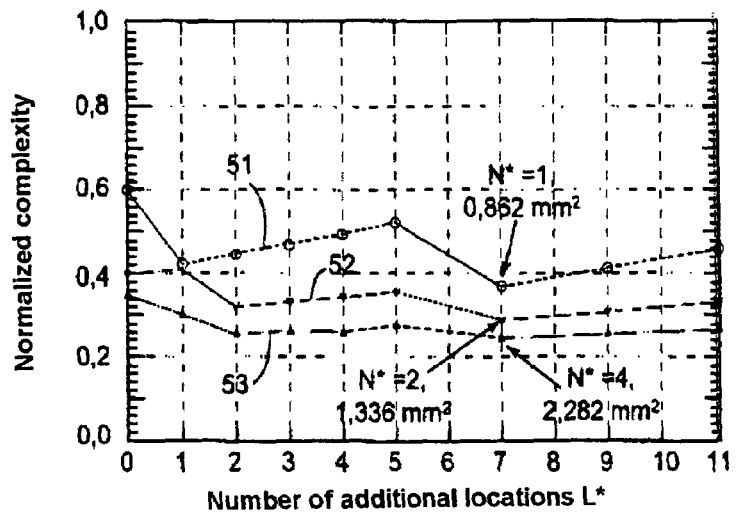
FIGS. 5A and 5B illustrate an exemplary dimensioning of a decoder according to the invention.

The microelectronics technology used is the 0.18 μm HCMOS process from "Taiwan Semiconductor Manufacturing Company" (TSMC). The transmission of the data is characterized by a spectral efficiency η=1 bps/Hz and a ratio $E_b/N_0$=2.75 dB. Use is made of quadrature phase shift keying (QPSK) modulation with r=½ and blocks of length K=748 bits; the allowable FER is $10^{-5}$ and $P_B^*=10^{-7}$. Under these conditions, FIG. 5A shows the complexity (area of silicon) of the decoder, normalized with respect to the case of an architecture with a fixed number of iterations, for $\Gamma^*=5/E\{T_s\}$ (curve 51), $\Gamma^*=10/E\{T_s\}$ (curve 52) and $\Gamma^*=20/E\{T_s\}$ (curve 53). In the three cases, the optimal number of additional memory locations is 7, whereas N* equals 1, 2 and 4 respectively. It is seen that the gain in terms of complexity as compared with the architectures with a fixed number of iterations increases with the data bit rate and reaches a factor of 4 for $\Gamma^*=20/E\{T_s\}$. The actual complexity, in mm², is identical in the figure for each optimal configuration.

As a function of the constraints related to the technology for embodying a decoder according to the invention, cost functions other than complexity may be taken into account during design.

Figure 1A:
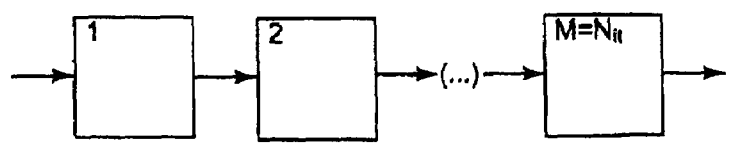
FIGS. 1A, 1B and 1C refer to the prior art alluded to in the preamble.
Figure 1B:
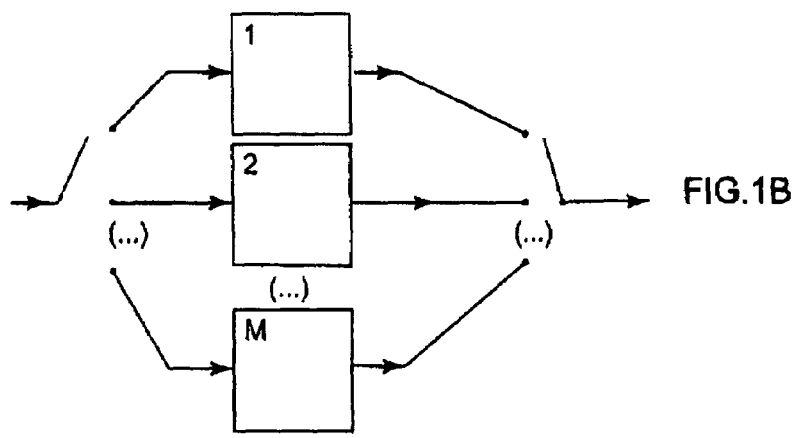
Figure 1C:
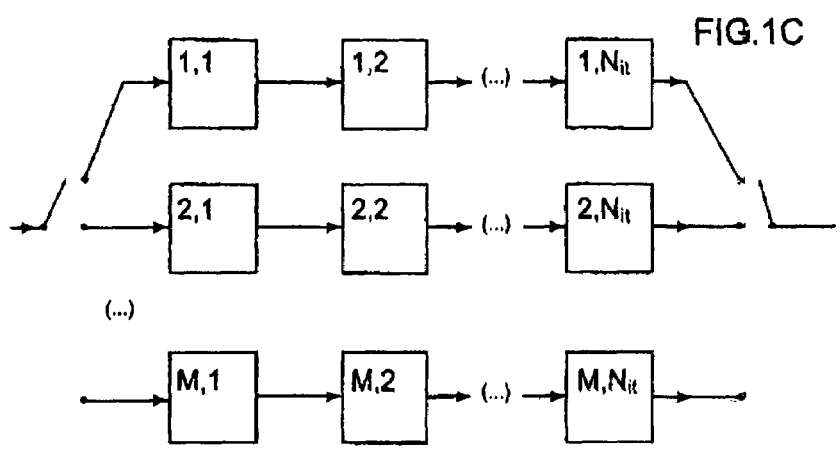
Figure 5B:
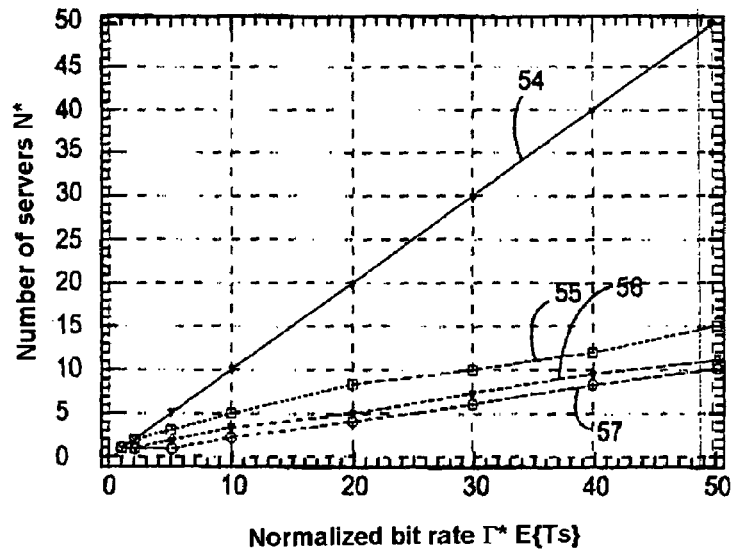

FIG. 5B shows dependence on the number of servers to be used to obtain a given bit rate $\Gamma^*$, expressed in $1/E\{T_s\}$ units, for various decoder architectures. Curve 54 refers to one of the architectures of FIG. 1, which do not allow the application of a stopping rule; the number of servers is therefore simply equal to the product $\Gamma^*\cdot E\{T_s\}$. Curve 55 corresponds to the case L=0: the number of servers must be sufficient for the probability for them all to be busy at the same instant to be sufficiently small, more precisely less than or equal to $P_B^*$. Curve 56 has been calculated for L=5; finally, curve 57 corresponds to an unlimited buffer memory.

In the case $\Gamma^*=50$, for example, the use of a stopping criterion, and hence of statistical multiplexing of the packets, even without additional memory locations, reduces the number of servers from 50 to 15. The addition of 5 memory locations reduces the number of servers to 11, which is still very advantageous, while even an "infinite" buffer memory does not make it possible to drop below 10 servers: there is therefore no reason to increase the value of L excessively. In fact, in the case considered, the small length of the blocks (K=748 bits) renders the complexity of the system quite insensitive to variations in L. If substantially longer blocks are considered, the complexity increases greatly if the number of memory locations exceeds its optimum value.

Figure 6:
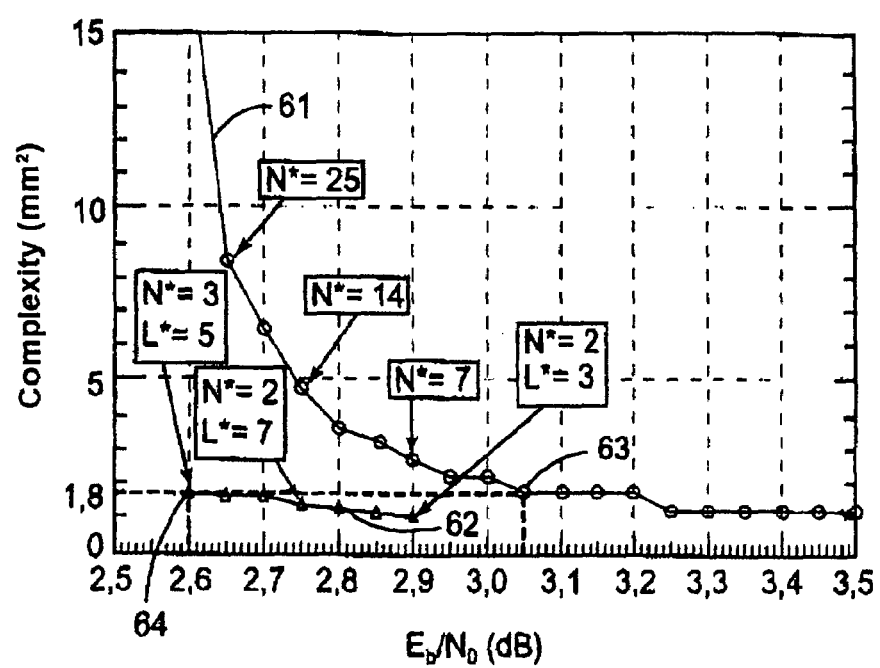
FIG. 6 shows how the complexity of a decoder according to the invention and of a decoder with a fixed number of iterations, which are equivalent in terms of bit rate and error rate, vary as a function of the energy per information bit ($E_b/N_0$) of the signal to be decoded.

Hitherto, the case has always been considered of a communication system with a bit rate $\Gamma^*$ and a ratio $E_b/N_0$ (and hence a signal-to-noise ratio) which are prescribed, and it is proposed that the complexity of the decoder be minimized. The decoder's performance improvement obtained by the present invention can also be utilized to decrease the signal-to-noise ratio, and hence the power transmitted, while maintaining the complexity of the system (or another cost function) within acceptable limits. Represented in FIG. 6 is the complexity, in mm² of silicon, as a function of $E_b/N_0$ for a decoder with a fixed number of iterations (curve 61, circles) and for a decoder according to the invention (curve 62, triangles). The characteristics of the transmission system are the same as for FIGS. 5A and 5B, with $\Gamma^*=10/E\{T_s\}$. It is seen that for a fixed complexity, for example, 1.8 mm², the present invention makes it possible to reduce $E_b/N_0$ from 3.25 (point 63) to 2.6 dB (point 64), this leading to a decrease in power transmitted of around 14%. The attraction of the invention is easily understood, in particular in mobile telephony and space applications, where energy consumption is particularly critical.

Figure 4C:
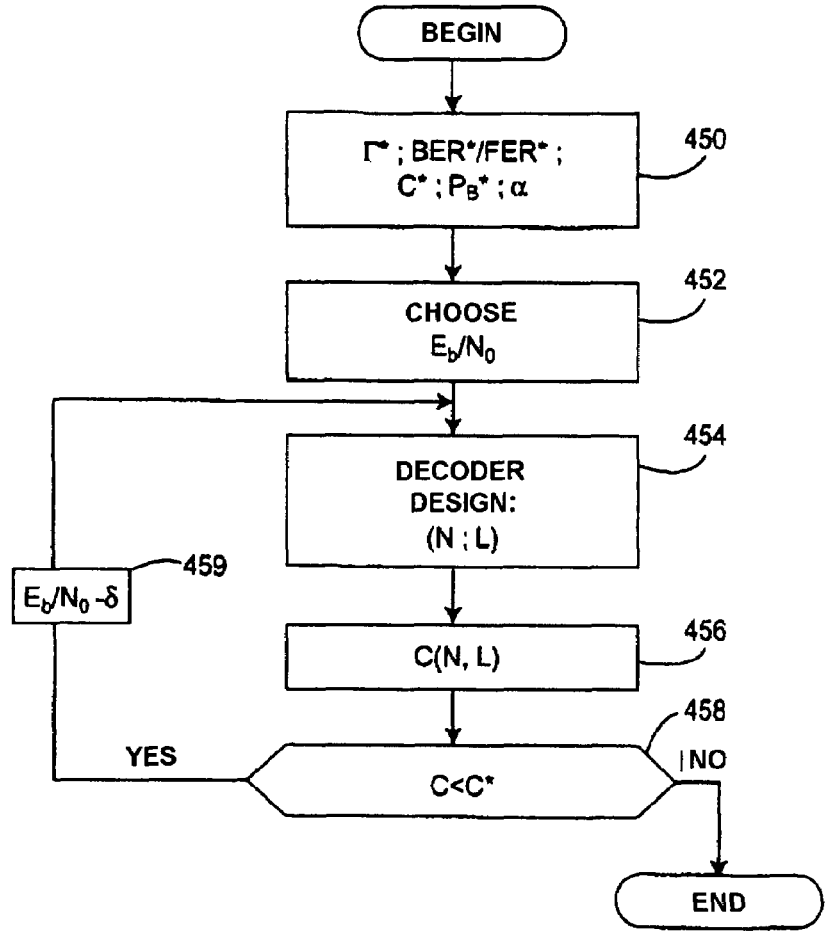

A dimensioning process for a decoder according to the invention aimed at minimizing the power transmitted, and hence the ratio $E_b/N_0$ of the signal to be decoded, is illustrated in FIG. 4C.

One begins by determining the bit rate $\Gamma^*$, the error rate (BER*/FER*) and the blocking probability ($P_B^*$) that are allowable, a cost function (C(N, L)) and an allowable maximum value (C*) of said cost function (step 450). In step 452 a first trial value of $E_b/N_0$ is chosen; in step 454 a decoder is dimensioned, by one of the processes illustrated in FIGS. 4A and 4B, for this value of $E_b/N_0$ and (step 456) the corresponding value of C(N, L) is calculated. If this value is less than C* (test step 458), $E_b/N_0$ is decreased by a predetermined quantity δ (step 459) and we begin again from step 454, otherwise we pick the last pair (N, L) for which C≦C*. Obviously, if C>C* at the first iteration, it is necessary to begin again with a higher value of $E_b/N_0$. It is important to observe that, for each value of $E_b/N_0$, the PDF($T_s$) must be recalculated.

Figure 4D:
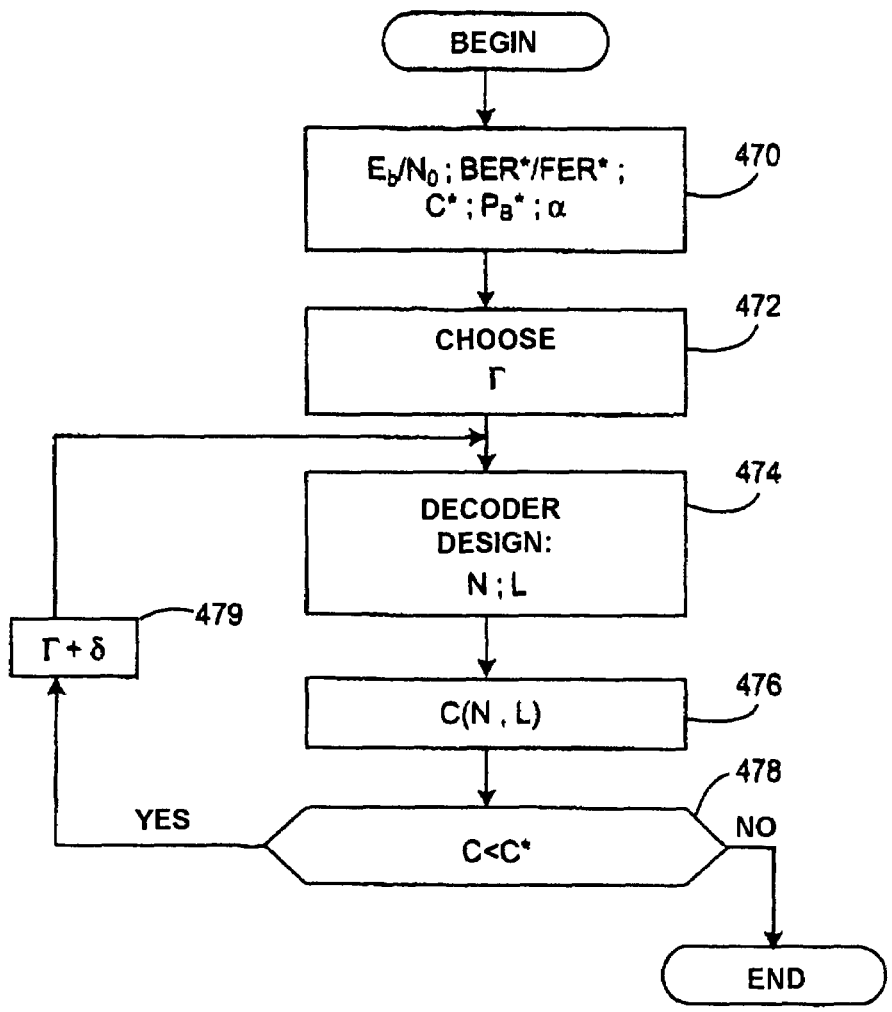

Again, it is possible to choose the pair (N*, L*) in such a way as to maximize the bit rate Γ for a given complexity (or a value of another cost function) and a given ratio $E_b/N_0$, as illustrated by FIG. 4D.

One begins by determining the allowable error rate (BER*/FER*) and the allowable blocking probability ($P_B^*$), the ratio $E_b/N_0$, a cost function (C(N, L)) and an allowable maximum value (C*) of said cost function (step 470). In step 472 a first trial value of the bit rate Γ is chosen; in step 474 a decoder is dimensioned, by one of the processes illustrated in FIGS. 4A and 4B, for this value of Γ and (step 476) the corresponding value of C(N, L) is calculated. If this value is less than C* (test step 478), Γ is increased by a predetermined quantity δ (step 479) and we begin again from step 474, otherwise we pick the last pair (N, L) for which C≦C*. Obviously, if C>C* at the first iteration, it is necessary to begin again with a smaller value of Γ.

The person skilled in the art can easily refine these processes: for example, when C exceeds C* for the first time, it is possible to decrease the value of δ so as to approach closer to the allowable minimum value of $E_b/N_0$ (FIG. 4C) or the maximum bit rate (FIG. 4D)

Other possible criteria for optimizing the decoder will be apparent in an obvious manner to the person skilled in the art depending on the specific application for which a decoder according to the present invention is provided.

In processes 4A-4D it is understood that some of the steps may be performed simultaneously.

Although in the detailed description only the particular case of turbo codes has been considered, the present invention applies equally to the decoding of all the other iterative codes such as, for example, "turbo-like" codes, low-density parity check (LDPC) codes, interference cancellation (IC) codes, serial interference cancellation (SIC) codes and parallel interference cancellation (PIC) codes, without this list being regardable as exhaustive.

The invention claimed is:

1. An iterative decoder, comprising:
   a plurality of servers which each perform the iterative decoding of a data block;
   an input buffer memory for temporarily storing the data blocks to be decoded by the servers;
   a control unit for allocating each data block to be decoded to a server; in which the number of iterations of the decoding procedure performed by each server is determined on the basis of a stopping criterion and the control unit allocates data blocks to be decoded to the various servers as and when they make themselves available, wherein:
   the input buffer memory comprises N+L memory locations, where N is the number of servers and L is the number of so-called additional locations;
   each block to be decoded which is received while all the servers are busy is stored in one of the L additional locations possibly available, or it is lost if the input buffer memory is entirely filled; and
   the number L of additional locations and the number N of servers are such that the probability $P_B$ of a block being lost, calculated on the basis of a queuing model of D/G/N/N+L type, satisfies the condition $P_B \leq \alpha \cdot FER*$, where FER* is the error rate in the blocks allowed and α<1.

2. The iterative decoder as claimed in claim 1, in which α≦0.01.

3. The iterative decoder as claimed in claim 1, in which, among all the pairs of values of L and of N making it possible to attain a sufficiently high bit rate Γ and a sufficiently low blocking probability $P_B$, that one which minimizes the silicon area occupied by the decoder is chosen.

4. The iterative decoder as claimed in claim 1, in which the input buffer memory is common to all the servers and is accessible in parallel.

5. The iterative decoder as claimed in claim 4, in which the data packets stored in the input buffer memory are allocated to the available servers on the basis of the first-in-first-out principle (FIFO).

6. The iterative decoder as claimed in claim 1, also comprising an output buffer memory for temporarily storing the data blocks decoded by the servers.

7. The iterative decoder as claimed in claim 1, in which the control unit verifies at regular intervals whether the stopping condition for each server is satisfied.

8. The iterative decoder as claimed in claim 1, in which the stopping condition is verified after each iteration of the decoding procedure.

9. The iterative decoder as claimed in claim 1, in which the servers are decoders chosen from among: "turbo" decoders, "turbo-like" decoders, low-density parity check (LDPC) decoders, interference cancellation (IC) decoders, serial interference cancellation (SIC) decoders and parallel interference cancellation (PIC) decoders.

10. The iterative decoder as claimed in claim 1, also comprising an extrinsic memory used by the servers during decoding.

11. A communication system using an iterative decoder as claimed in claim 1.

12. A process for manufacturing an iterative decoder as claimed in claim 1, comprising the following steps:
   A) designing the decoder by applying the following substeps:
      a) determining at least one of the following parameters: the bit rate Γ* of the data to be decoded, the energy per information bit $E_b/N_0$ of the signal carrying the information to be decoded, the error rate allowable in the bits or in the blocks BER* or FER*, the maximum allowable blocking probability $P_B$*, the ratio α of this probability to the allowable error rate, as well as a cost function C(N, L) which must be minimized by the decoder;
      b) determining on the basis of at least one of said parameters a pair (N, L) which makes it possible to minimize the cost function C(N, L); and
   B) embodying a decoder, having the values N, L determined in substep (b).

13. The process as claimed in claim 12, wherein (b) comprises:
   i. choosing an embodiment of the servers;
   ii. determining a maximum value $L_{max}$ and a minimum value $L_{min}$ which are allowable for the number of additional locations of the input buffer memory;
   iii. using the data obtained during the first two substeps to calculate the probability density function FDP of the service time $T_s$, that is to say the time required by a server to decode an information block, as well as the expected value $E\{T_s\}$ of said service time;
   iv. initially putting the number of additional locations of the input buffer memory equal to $L=L_{min}$;
   v. initially putting the number of servers equal to $N=\Gamma* \cdot E\{T_s\}$;
   vi. modeling the decoder as a queuing system of D/G/N/N+L type and calculating the corresponding blocking probability $P_B$;
   vii. if $P_B>P_B*=\alpha \cdot FER*$ or $\alpha \cdot BER*$, increasing N by a unit and repeating substep vi;
   viii. otherwise picking the pair (N, L);
   ix. if $L*<L_{max}$ increasing L by a unit and restarting the procedure from step v;
   x. out of all the pairs (N, L) picked, choosing that one (N*, L*) which makes it possible to minimize the cost function C(N, L).

14. The process as claimed in claim 12, wherein (b) comprises:
   i. choosing an embodiment of the servers;
   ii. determining a maximum value $L_{max}$ and a minimum value $L_{min}$ which are allowable for the number of additional locations of the input buffer memory 23;

iii. using the data obtained during the first two substeps to calculate the probability density function FDP of the service time $T_s$, that is to say the time required by a server to decode an information block in such a way that the error rate is less than or equal to BER* or FER*, as well as the expected value $E\{T_s\}$ of said service time;

iv. initially putting the number of additional locations of the input buffer memory equal to $L=L_{min}$;

v. taking a high enough initial value of the number of decoders N* so that the blocking probability $P_B$ is less than $P_B^*$ even if L=0;

vi. modeling the decoder as a queuing system of D/G/N/N+L type and calculating the corresponding blocking probability $P_B$;

vii. if $P_B<P_B^*=\alpha$FER* (or $\alpha$BER*), decreasing N* by a unit and repeating substep vi;

viii. otherwise picking the pair (N+1, L);

ix. if $L^*<L_{max}$ increasing L* by a unit and restarting the procedure from step v;

x. out of all the pairs (N, L) picked, choosing that one which makes it possible to minimize the cost function C(N, L).

15. The process as claimed in claim 12, wherein (b) comprises:

i. undertaking the design of a decoder for various values of the energy per information bit ($E_b/N_0$);

ii. choosing the pair (N*, L*) which makes it possible to obtain an allowable error rate BER* or FER* at the bit rate Γ of the data to be decoded for the lowest value of the energy per information bit $E_b/N_0$, while giving, for the cost function C(N, L), a value less than or equal to a maximum allowable value C*.

16. The process as claimed in claim 12, wherein (b) comprises:

i. undertaking the design of a decoder for various values of the bit rate Γ;

ii. choosing the pair (N*, L*) which makes it possible to obtain the highest bit rate Γ* an allowable error rate BER* or FER* for the chosen value of the energy per information bit $E_b/N_0$, while giving, for the cost function C(N, L) a value lower than or equal to a maximum allowable value C*.

17. The process as claimed in claim 12, in which the cost function C is proportional to the physical dimensions of the electronic circuit which constitutes the decoder.

18. The iterative decoder as claimed in claim 1, wherein the servers are disposed parallel to each other.

19. The iterative decoder as claimed in claim 1, wherein the number L of additional locations is different from zero.

* * * * *